(12) United States Patent
Mahler et al.

(10) Patent No.: US 9,793,255 B2
(45) Date of Patent: Oct. 17, 2017

(54) POWER SEMICONDUCTOR DEVICE INCLUDING A COOLING MATERIAL

(71) Applicant: Infineon Technologies AG, Neubiberg (DE)

(72) Inventors: Joachim Mahler, Regensburg (DE); Ralf Otremba, Kaufbeuren (DE); Hans-Joachim Schulze, Taufkirchen (DE); Guenther Ruhl, Regensburg (DE); Hans-Joerg Timme, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/595,669

(22) Filed: Jan. 13, 2015

(65) Prior Publication Data

US 2015/0123142 A1    May 7, 2015

Related U.S. Application Data

(63) Continuation-in-part of application No. 13/754,986, filed on Jan. 31, 2013, now Pat. No. 9,117,748.

(51) Int. Cl.

| | |
|---|---|
| *H01L 29/06* | (2006.01) |
| *H01L 27/02* | (2006.01) |
| *H01L 27/088* | (2006.01) |
| *H01L 27/06* | (2006.01) |
| *H01L 23/427* | (2006.01) |
| *H01L 23/367* | (2006.01) |
| *H01L 29/49* | (2006.01) |
| *H01L 29/78* | (2006.01) |

(Continued)

(52) U.S. Cl.
CPC ...... *H01L 27/0248* (2013.01); *H01L 23/3677* (2013.01); *H01L 23/4275* (2013.01); *H01L 27/0676* (2013.01); *H01L 27/088* (2013.01); *H01L 29/49* (2013.01); *H01L 29/7813* (2013.01); *H01L 23/525* (2013.01); *H01L 29/4983* (2013.01); *H01L 29/7397* (2013.01); *H01L 29/8611* (2013.01); *H01L 2924/0002* (2013.01)

(58) Field of Classification Search
CPC ..................................................... H01L 27/088
USPC ............................................................ 257/5
See application file for complete search history.

(56) References Cited

U.S. PATENT DOCUMENTS

| | | |
|---|---|---|
| 5,068,703 A | 11/1991 | Conzelmann et al. |
| 6,043,969 A | 3/2000 | Sharpe-Geisler |

(Continued)

FOREIGN PATENT DOCUMENTS

| | | |
|---|---|---|
| CN | 1589496 A | 3/2005 |
| DE | 112008000371 T5 | 12/2009 |

(Continued)

*Primary Examiner* — Igwe U Anya
(74) *Attorney, Agent, or Firm* — Murphy, Bilak & Homiller, PLLC

(57) ABSTRACT

A power semiconductor device includes a wiring structure adjoining at least one side of a semiconductor body and comprising at least one electrically conductive compound. The power semiconductor device further includes a cooling material in the wiring structure. The cooling material is characterized by a change in structure by means of absorption of energy at a temperature $T_C$ ranging between 150° C. and 400° C.

25 Claims, 7 Drawing Sheets

(51) Int. Cl.
*H01L 23/525* (2006.01)
*H01L 29/861* (2006.01)
*H01L 29/739* (2006.01)

(56) References Cited

U.S. PATENT DOCUMENTS

| | | |
|---|---|---|
| 6,798,066 B1 | 9/2004 | Motsiff et al. |
| 6,825,727 B1 | 11/2004 | Hill |
| 2003/0213979 A1* | 11/2003 | Nakajima ............ H01L 23/427 257/200 |
| 2008/0049486 A1 | 2/2008 | Gruening-von Schwerin |
| 2008/0099326 A1 | 5/2008 | Ye et al. |
| 2008/0099814 A1 | 5/2008 | Gruening-von Schwerin et al. |
| 2008/0164603 A1 | 7/2008 | Sturcken et al. |
| 2008/0266803 A1 | 10/2008 | Golhardt et al. |
| 2009/0001336 A1* | 1/2009 | Habib ...................... G01K 7/16 257/2 |
| 2009/0034355 A1 | 2/2009 | Wang |
| 2009/0180314 A1* | 7/2009 | Liu ..................... G11C 11/5678 365/163 |
| 2009/0242865 A1 | 10/2009 | Lung et al. |
| 2009/0284923 A1* | 11/2009 | Rytka ................. H05K 7/20927 361/700 |
| 2009/0315090 A1 | 12/2009 | Weis et al. |
| 2010/0061145 A1 | 3/2010 | Weis |
| 2010/0096613 A1 | 4/2010 | Morikawa et al. |
| 2010/0177553 A1 | 7/2010 | Lee et al. |
| 2010/0315866 A1 | 12/2010 | Park et al. |
| 2011/0305074 A1 | 12/2011 | Lung et al. |
| 2012/0079446 A1 | 3/2012 | Kumakura et al. |
| 2012/0147668 A1 | 6/2012 | Song et al. |
| 2012/0248400 A1 | 10/2012 | Yu et al. |
| 2013/0105759 A1 | 5/2013 | Cheng |
| 2013/0161583 A1 | 6/2013 | Blomme et al. |
| 2014/0138600 A1 | 5/2014 | Satoh et al. |

FOREIGN PATENT DOCUMENTS

| | | |
|---|---|---|
| JP | 2008147590 A | 6/2008 |
| WO | 0223114 A1 | 3/2002 |

* cited by examiner

POWER SEMICONDUCTOR DEVICE INCLUDING A COOLING MATERIAL

PRIORITY CLAIM

This application is a continuation-in-part of U.S. patent application Ser. No. 13/754,986 filed on 31 Jan. 2013, and also claims priority to German Patent Application No. 10 2014 100 522.8 filed on 17 Jan. 2014, the content of both of said applications incorporated herein by reference in their entirety.

BACKGROUND

In semiconductor power devices such as insulated-gate bipolar transistors (IGBTs), diodes, thyristors, and power field effective transistors (power-FETs) large thermal stress may occur in forward and reverse operation modes. Such large thermal stress may be accompanied by current filaments and hot-spots that may lead to destruction of the semiconductor power device under extreme operation conditions, for example operation conditions out of specification.

Therefore, it is desirable to improve heat dissipation caused by current filaments in semiconductor power devices.

SUMMARY

According to an embodiment of a power semiconductor device, the semiconductor device includes a wiring structure adjoining at least one side of a semiconductor body and comprising at least one electrically conductive compound. The power semiconductor device further includes a cooling material in the wiring structure. The cooling material is characterized by a change in structure by means of absorption of energy at a temperature $T_c$ ranging between 150° C. and 400° C.

Those skilled in the art will recognize additional features and advantages upon reading the following description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description the intended advantages will be readily appreciated as they become better understood by reference to the following detailed description. The elements of the drawings are not necessarily to scale relative to each other. Like reference numerals designate corresponding similar parts.

DETAILED DESCRIPTION

In the following detailed description reference is made to the accompanying drawings, which form a part hereof, and in which are shown by way of illustration specific embodiments in which the invention may be practiced. It is to be understood that other embodiments may be utilized and structural or logical changes may be made without departing from the scope of the present invention. For example features illustrated or described for one embodiment can be used on or in conjunction with other embodiments to yield yet a further embodiment. It is intended that the present invention includes such modifications and variations. The examples are described using specific language, which should not be construed as limiting the scope of the appending claim. The drawings are not scaled and are for illustrative purposes only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor.

The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1A:
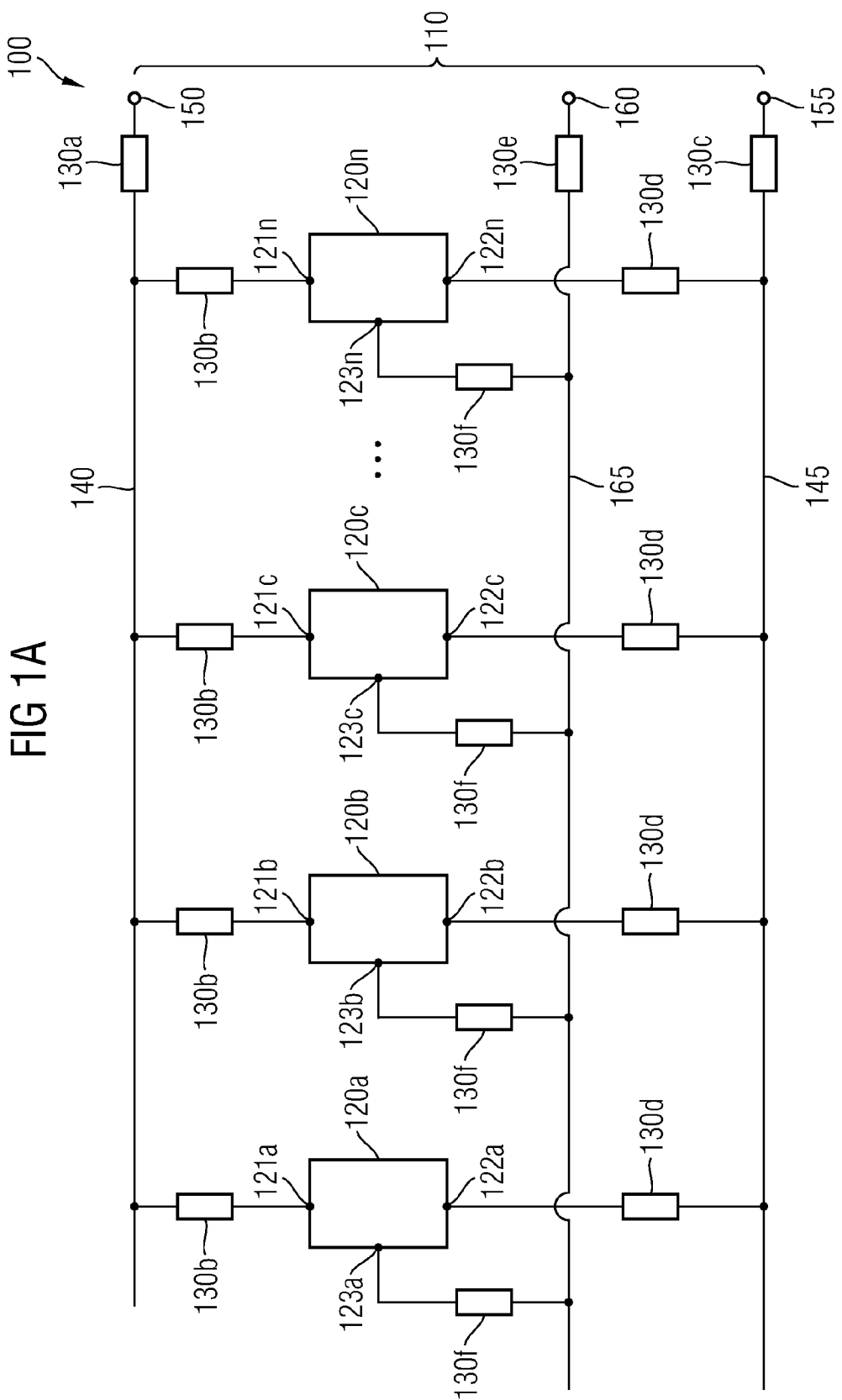
FIG. 1A illustrates one embodiment of an equivalent circuit of a power transistor including a plurality of transistor cells and a cooling material.

FIG. 1A illustrates an equivalent circuit diagram of a power semiconductor device 100 including a transistor 110. According to one embodiment, the transistor 110 is a field effective transistor (FET), e.g. a lateral or vertical FET. According to another embodiment the transistor 100 is a insulated gate bipolar transistor (IGBT). The semiconductor device may also be a superjunction device including alternating p-doped and n-doped regions, e.g. columns or stripes.

According to one embodiment, the semiconductor device is a discrete semiconductor device. According to another embodiment, the semiconductor device is an integrated circuit including the transistor 110 and further circuit elements, e.g. further transistors such as FETs, bipolar transistors, resistors, capacitors, and other active or passive circuit elements.

The transistor 110 includes a plurality of transistor cells 120a to 120n in a semiconductor body. According to one embodiment, the number of transistor cells connected in parallel may range between 10 and 10000. According to one embodiment, the number of transistor cells may be chosen with respect to a desired on-state resistance of a semiconductor power transistor. According to one embodiment, the transistor is one of a power FET and a power IGBT configured to conduct currents of more than 1 A between first and second load terminals. The transistor 110 may include a superjunction structure.

The semiconductor body may include a semiconductor substrate, e.g. a silicon (Si) substrate, a silicon carbide (SiC) substrate, a gallium nitride (GaN) substrate or another single semiconductor or compound semiconductor substrate. Furthermore, one or more optional semiconductor layer(s), e.g. epitaxial semiconductor layers, may be formed on the semiconductor substrate. According to one embodiment, the semiconductor body includes a wide bandgap material with a bandgap greater than 1.7 eV. The wide bandgap material my be one of gallium phosphide (GaP), gallium nitride (GaN) and silicon carbide (SiC), for example. According to another embodiment, the semiconductor body is a thin silicon substrate, i.e. a silicon substrate having a thickness less than 80 µm, or less than 50 µm that may be manufactured by removing substrate material from a front and/or rear side from a base substrate.

In one embodiment, the transistor 110 is a power transistor and the semiconductor device 100 is a discrete semiconductor device or an integrated circuit. The transistor cells 120a to 120n may be one of bipolar NPN transistor, bipolar PNP transistors, n-channel FETs, p-channel FETs, IGBTs.

Each of the transistor cells 120a to 120n includes a first load terminal 121a to 121n, a second load terminal 122a to 122n and a control terminal 123a to 123n. According to one embodiment the transistor cells 120a to 120n are adapted to conduct currents of more than 1 A between the first load terminal 121a to 121n and the second load terminal 122a to 122n, thereby forming a power transistor device.

In case of a bipolar transistor, the first load terminals 121a to 121n may be a emitter terminals, the second load terminals 122a to 122n may be collector terminals, and the control terminals 123a to 123n may be base terminals. The allocation of the first and second load terminals 121a to 121n, 122a to 122n may be interchanged with respect to the above allocation. In other words, the first load terminals 121a to 121n may be collector terminals and the second load terminals 122a to 122n may be the emitter terminals.

In case of a FET, the first terminals 121a to 121n may be source terminals, the second load terminals 122a to 122n may be drain terminals and the control terminals 123a to 123n may be gate terminals. The allocation of the first and the second load terminals 121a to 121n, 122a to 122n may be interchanged with respect to the above allocation. In other words, the first load terminals 121a to 121n may be the drain terminals and the second load terminals 122a to 122n may be the source terminals.

In case of an IGBT, the first load terminals 121a to 121n may be emitter terminals, the second load terminals 122a to 122n may be collector terminals, and the control terminals 123a to 123n may be gate terminals. The allocation of the first and second load terminals 121a to 121n, 122a to 122n may be interchanged with respect to the above allocation. In other words, the first load terminals 121a to 121n may be the collector terminals and the second load terminals 122a to 122n may be the emitter terminals.

The first load terminals 121a to 121n are electrically connected via a first electrical connection 140 to a transistor cell array source terminal 150, e.g. a source bond pad or a contact area of a source line. The second load terminals 122a to 122n are electrically connected via a second electrical connection 145 to a transistor cell array drain terminal 155, e.g. a drain bond pad or a contact area of a drain line. The control terminals 123a to 123n are electrically connected via a gate line 165 to a transistor cell array gate terminal 160, e.g. a gate bond pad or a contact area of the gate line.

The electrical connections 140, 145 and the gate line 165 may include low-ohmic materials, e.g. one, a plurality of or any combination of a metal, a metal alloy and a highly doped semiconductor. According to one embodiment, the electrical connections are part of one or more wiring layer(s) and interconnection elements between the wiring layers, e.g. vias. According to one embodiment, the gate line 165 includes doped polysilicon gate line material.

In case of a discrete semiconductor device, the transistor cell array source terminal 150, the transistor cell array drain terminal 155, and the transistor cell array gate terminal 160 may be bond pads.

In case of an integrated circuit, at least one of the transistor cell array source terminal 150, the transistor cell array drain terminal 155 and the transistor cell array gate terminal 160 is electrically coupled to another circuit element of the semiconductor device, i.e. to another circuit element integrated in the semiconductor body. According to one embodiment, the transistor cell array gate terminal 160 is electrically coupled to a gate driver circuit integrated in the semiconductor body.

The transistor 110 includes a cooling material illustrated in the equivalent circuit diagram of FIG. 1A by simplified elements 130a . . . 130f. The transistor 110 may include one, any combination of or all of elements 130a . . . 130f. The cooling material may be in contact with or form part of the first electrical connection 140 from the transistor cell array source terminal 150 to one or several or all of the first load terminals 121a . . . 121n. According to one embodiment, the cooling material is in contact with or forms part of elements 130b of the first electrical connection 140 that are separate for each of the first load terminals 121a . . . 121n. In other words, each transistor cell includes a separate portion of the cooling material that is in contact with or forms part of a respective part of the first electrical connection 140 which is located between a respective one of the first load terminals 121a . . . 121n and a part of the first electrical connection 140 that is shared between all of the first load terminals 121a . . . 121n. In addition or alternatively, the cooling material is in contact with or forms part of element 130a of the first electrical connection 140 that is common for each of the first load terminals 121a . . . 121n.

In addition or alternatively, the cooling material may be in contact with or form part of the second electrical connection 145 from the transistor cell array drain terminal 155 to one or several or all of the second load terminals 122a . . . 122n. According to one embodiment, the cooling material is in contact with or forms part of elements 130d of the second electrical connection 145 that are separate for each of the second load terminals 122a . . . 122n. In other words, each transistor cell includes a separate portion of the cooling material that is in contact with or forms part of a respective part of the second electrical connection 145 which is located between a respective one of the second load terminals 122a . . . 122n and a part of the second electrical connection 145 that is shared between all of the second load terminals 122a . . . 122n. In addition or alternatively, the PCM is in contact with or forms part of element 130c of the second electrical connection 145 that is common for each of the second load terminals 122a . . . 122n.

In addition or alternatively, the cooling material may be in contact with or form part of the gate line 165 from the transistor cell array gate terminal 160 to one or several or all of the control terminals 123a . . . 123n. According to one embodiment, the PCM is in contact with or forms part of elements 130f of the gate line 165 that are separate for each of the control terminals 123a . . . 123n. In other words, each transistor cell includes a separate portion of the cooling material that is in contact with or forms part of a respective part of the gate line 165 which is located between a respective one of the control terminals 123a . . . 123n and a part of the gate line 165 that is shared between all of the control terminals 123a . . . 123n. In addition or alternatively, the cooling material is in contact with or forms part of element 130e of the gate line 165 that is common for each of the control terminals 123a . . . 123n.

According to one embodiment, the cooling material is arranged at a chip front side, e.g. on or below a chip wiring layer, in contact with a surface of the semiconductor body and/or on dielectric layers adjoining the surface of the semiconductor body. In addition or as an alternative, the cooling material may be formed at a rear side of a chip, e.g. in the form of distinct parts and/or as a continuous area covering multiple transistor cells. As an example, the cooling material may be part of a wiring, e.g. metal layer stack at the rear side.

The cooling material in the wiring structure exhibits a change in structure by absorption of energy at a temperature $T_c$ between 150° C. and 400° C. (endothermic change). The energy absorption in the specified temperature has a cooling effect and improves the thermal stability of the power semiconductor device by counteracting current filaments caused by increase of temperature due to current crowding.

According to one embodiment the cooling material is a phase change material (PCM) and exhibits a solid-solid-phase change at a phase transition temperature $T_c$ between 150° C. and 400° C. or between 200° C. and 300° C. According to an embodiment, the PCM is crystalline below the phase transition temperature $T_c$ and is amorphous above the phase transition temperature $T_c$.

The PCM may be disposed in crystalline form locally or large-area in regions of the semiconductor device 100 carrying high current densities and high thermal loads during operation. Such regions may be regions of high thermal load during switching or regions of high electric fields, e.g. source regions or emitter regions or edge regions of IGBTs, diodes, power-FETs, regions of early avalanche breakdown or latch-up, e.g. regions including break-over diodes which result in locally and well-reduced breakdown voltage of the device, deep trenches, and regions including amplifying gate structures of thyristors. The PCM may also be disposed in an area of the gate, e.g. gate connection. In this case, a temperature induced increase of a resistivity of the PCM results in a well-controlled turn off of individual gates due locally increased temperatures, e.g. due to current filaments.

During a short and intensive current pulse in these regions, the PCM exhibits a solid-solid phase transition at the phase change temperature $T_c$ within a short time period, e.g. within a typical period between 50 ns to 200 ns and absorbs latent heat while remaining at the phase change temperature $T_c$. In other words, the PCM acts as a heat sink and heat can effectively be dissipated by the PCM. This behavior counteracts occurrence of high temperatures in regions of the semiconductor device 100 in which the PCM is disposed and therefore counteracts hot spot generation and damage in these regions of the semiconductor device 100.

The phase transition temperature $T_c$ and the latent heat that is absorbed by the PCM may be adjusted by selecting the PCM or a combination of phase change materials accordingly. An amount of latent heat absorbed by the PCM may be adjusted by dimensions of PCM that is present locally. A thickness of the PCM may be adjusted with respect to an optimal combination of latent heat, local heat dissipation, and electrical conductivity.

There exist a broad range of PCMs, e.g. salts (e.g. $M_nH_2O$), organic PCMs (e.g. $C_nH_{2n+2}$), and eutectic compounds of PCMs that have characteristic phase transition temperatures $T_C$ and latent heats. According to one embodiment, the PCM includes a chalcogenide, e.g. GeSbTe (Germanium-Antimony-Tellurium or GST).

The PCM, e.g. GeSbTe, may be doped with one or a combination of carbon (C), nitrogen (N), oxygen (O), or indium (In) for adjusting the phase transition temperature $T_c$. A dopant concentration of C and N ranges typically between 2% and 10% and the phase transition temperature $T_c$ tends to increase with increasing dopant concentration. Thereby, the phase transition temperature may be adjusted between 200° C. and 300° C., for example.

A short current pulse of high amplitude as caused by e.g. a short circuit or by a cosmic radiation event can effect the phase change from the crystalline to the amorphous phase. A resistivity of the PCM in the amorphous phase is considerably higher than in the crystalline phase. Thus, the phase change causes a voltage drop due to increase of resistivity that counteracts the formation of current filaments and results decomposition of current filaments. The resistivity of the PCM may range between $10^{-4}$ Ωcm to $10^{-2}$ Ωcm in the crystalline phase, i.e. is low-ohmic and may range between 1 Ωcm to $10^3$ Ωcm in the amorphous phase.

The phase change of the PCM is reversible and amorphous parts of the PCM may be converted into crystalline form by an appropriate process, e.g. by annealing. Annealing may be achieved by a moderate current applied over an extended time period that heats the amorphous material over the crystallization temperature and keeps the amorphous material at this temperature until nucleation begins and the material starts recrystallization. Annealing may be carried out during normal operation of the semiconductor device 100.

According to another embodiment, the phase transition of the phase change material is from a solid phase below $T_c$ to a liquid phase above $T_c$.

According to an embodiment, the phase change material includes a metal or a metal compound. By way of example, the phase change material may include at least one of tin (Sn), bismuth (Bi), zinc (Zn), indium (In). Further embodiments include other metals or non-metals such as dielectrics exhibiting a phase change by absorption of energy in a temperature range between 150° C. and 400° C.

Figure 1B:
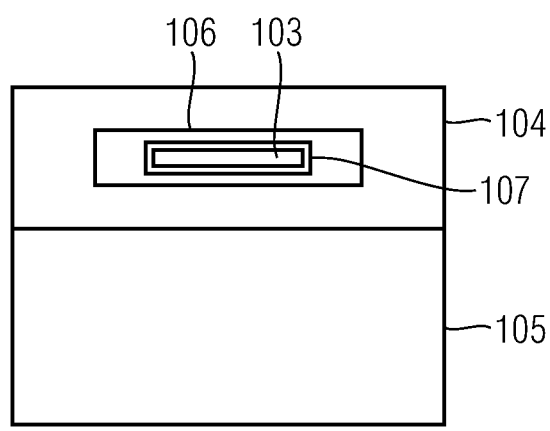
FIG. 1B illustrates one embodiment of an equivalent circuit of a power transistor including an encapsulated cooling material in a wiring structure.

In the embodiment illustrated in FIG. 1B a phase change material 103 in a wiring structure 104 adjoining a semiconductor body 105 is coated by a metallic structure 106. The metallic structure 106 may be made of one or more metallic materials. The metallic material may include a cavity in which the phase change material is located. The metallic structure 106 may be part of one or more metallic wiring levels(s) within the wiring structure 104. An intermediate layer 107 being non-reactive or immiscible with respect to each one of the phase change material 103 and the metallic structure 106 may be arranged between the metallic structure 106 and the phase change material 103. By way of example, aluminum (Al) is suitable for a metallic structure made of copper (Cu) and a phase change material made of Sn or Zn.

According to another embodiment, the cooling material includes a solid-phase chemical compound and is characterized by a reversible structural change at the temperature $T_c$. The reversible structural change may be a chemical isomerization, for example.

According to an embodiment, the chemical compound includes at least one of 1-ethyl-4-[4-methoxystyryl]-quinolinium compounds, cis-stilbazoliumbetaine compounds, N,N-dialkylam inostyrol dye, stilbenes, porphyrins, norbornadienes, spiro compounds, azo compounds.

An activation energy of the reversible cis-trans-isomerization of 1-ethyl-4-[4-methoxystyryl]-quinolinium compounds is approximately 25 kcal/mol (approximately 105 kJ/mol):

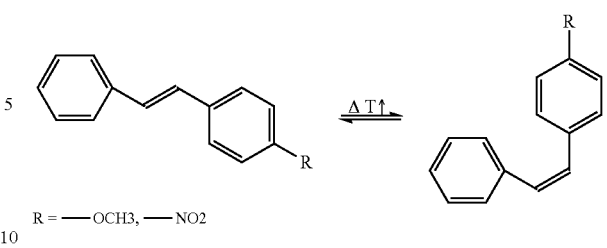

R = —OCH3, —NO2

Such molecules are also known to absorb heat from the environment when undergoing a phase change (solid/liquid) at certain temperatures.

By appropriately dimensioning an amount of an inserted chemical compound an energy absorption may be adjusted to a cooling requirement during operation of the semiconductor device, for example caused by an avalanche pulse.

The chemical compound may be used as a dielectric layer of the power semiconductor device. By appropriately selecting and/or modifying the chemical compound, for example with substituents, a dielectric constant may be varied and adjusted to a desired value.

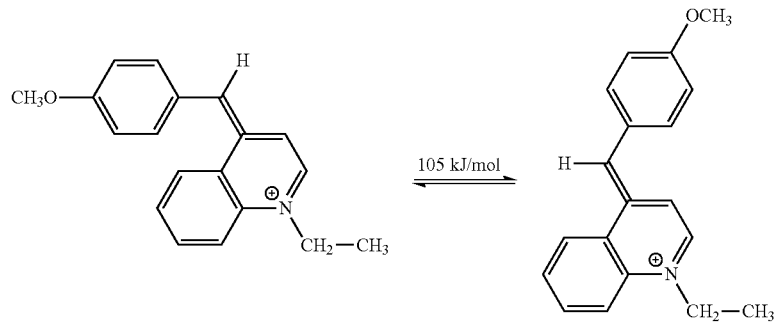

A molecular weight of this compound is approximately 289 g/mol. Thus, 289 g of this compound may absorb 105 kJ (=363 kJ/kg) of energy by a cis-trans-isomerization/rearrangement.

In unsubstituted stilbenes, thermodynamically more stable cis-stilbene is present at room temperature and turns into trans-stilbene configuration from 125° C. with a molar enthalpy of formation of approximately 136.7 kJ/mol. This amount of energy is absorbed from environment during transformation.

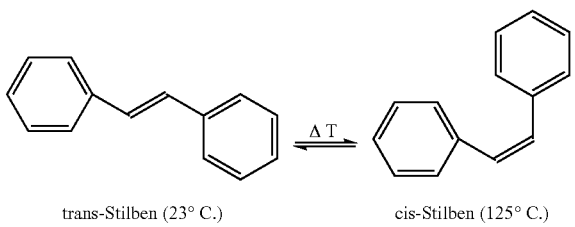

trans-Stilben (23° C.)     cis-Stilben (125° C.)

Isomerization temperatures may be varied and increased by inserting substitutents R.

The cooling material allows for a direct cooling at a spot of heat generation. The thermal stress acting on the chip package may be reduced, leading to an increase of reliability.

The chemical compound may be formed by front-end-of-line processes. Examples are chemical vapor deposition (CVD), physical vapor deposition (PVD), deposition from a solution/liquid.

The chemical compound may be integrated into the wiring structure/area in encapsulated or non-encapsulated form.

Figure 1C:
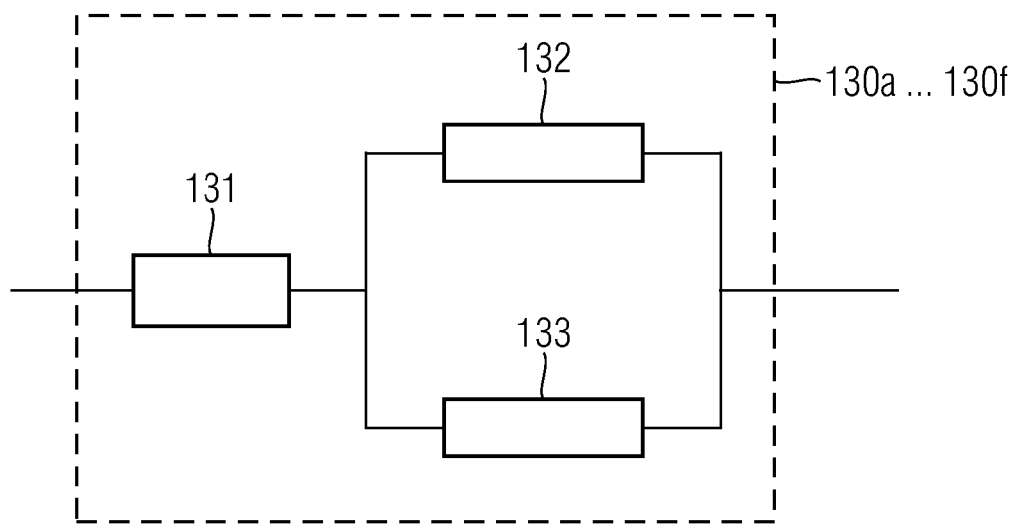
FIG. 1C illustrates one embodiment of an equivalent circuit of a part of an electrical connection of a power transistor device including a cooling material.

FIG. 1C illustrates one example of an equivalent circuit of any of the equivalent circuit elements 130a . . . 130f including the cooling material. The equivalent circuit elements 130a . . . 130f denote a part of the electrical connection from one of the transistor cells 120a to 120n to one of the transistor cell array source terminal 150, the transistor cell array drain terminal 155, and the transistor cell array gate terminal 160. The equivalent circuit elements 130a . . . 130f include a first resistor element 131 that is connected in series with a second resistor element 132 and a third resistor element 133, the second resistor element 132 and the third resistor element being connected in parallel.

According to one embodiment, the cooling material may be part of or correspond to the first resistor 131 and may therefore be serially connected to one or several or all of the transistor cells 120a to 120n and one of the transistor cell array source terminal 150, the transistor cell array drain terminal 155, and the transistor cell array gate terminal 160.

The resistors 132, 133 may include low-ohmic materials such as metal or highly doped semiconductor material, e.g. polysilicon, or a combination thereof. The resistors 132, 133 may also be combined. According to another example, one or both of resistors may include a cooling material and a low-ohmic material, e.g. metal and/or doped semiconductor material.

According to another embodiment, the cooling material may be part of or correspond to the second resistor 132 and/or third resistor 133. The cooling material may then be connected in series with a low-ohmic first resistor, e.g. a metal or a highly doped semiconductor.

Figure 1D:
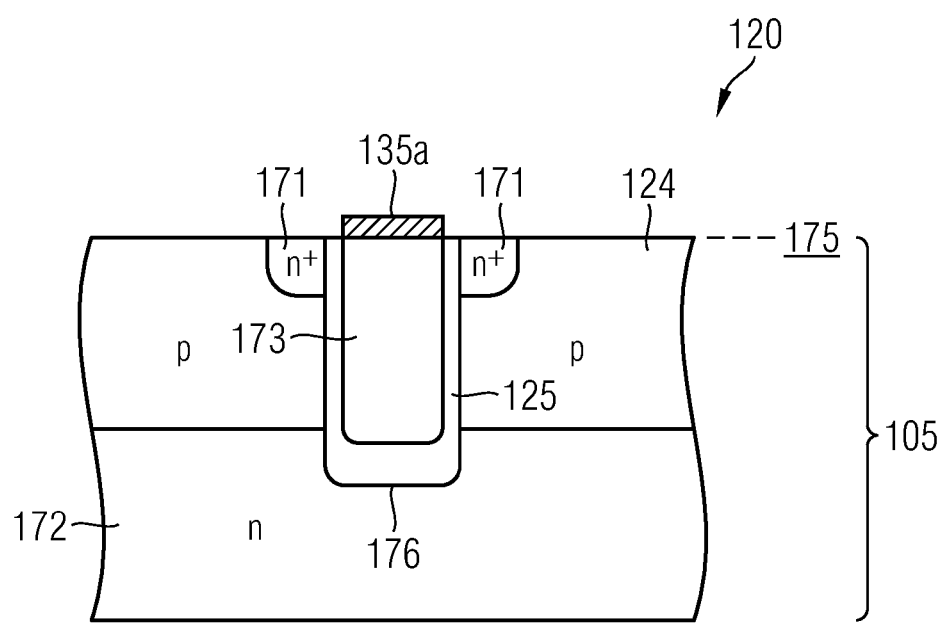
FIG. 1D to FIG. 1H illustrate cross-sectional views of embodiments of a trench gate transistor cell including a cooling material.

FIG. 1D illustrates a cross-sectional view of one embodiment of the transistor cells 120. In the illustrated embodiment, the transistor cell 120 is a trench gate transistor cell.

According to one embodiment, the semiconductor body 105 includes a p-doped body region 124 and an n-doped region 172, e.g. an n-doped drift zone electrically connected to the second load terminal 122 of the transistor cell 120. At a first surface 175 of the semiconductor body 105a trench 176 extends through the body region 124 into the n-doped region 172. The trench includes a gate electrode 173 that is electrically connected to or forms part of the control terminal 123 of the transistor cell 120 and is electrically isolated from a surrounding part of the semiconductor body 105 by a dielectric structure 125. An n$^+$-doped source region that is electrically connected to or forms part of the first load terminal 121 of the transistor cell 120 adjoins sidewalls of the trenches 176 at the first surface 175 of the semiconductor body 105.

Figure 1E:
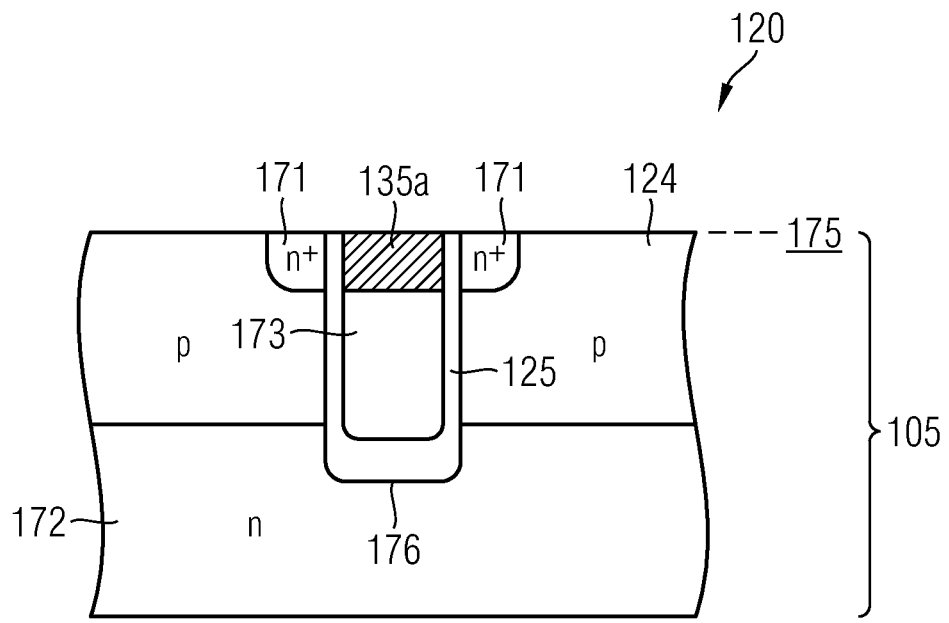
Figure 1F:
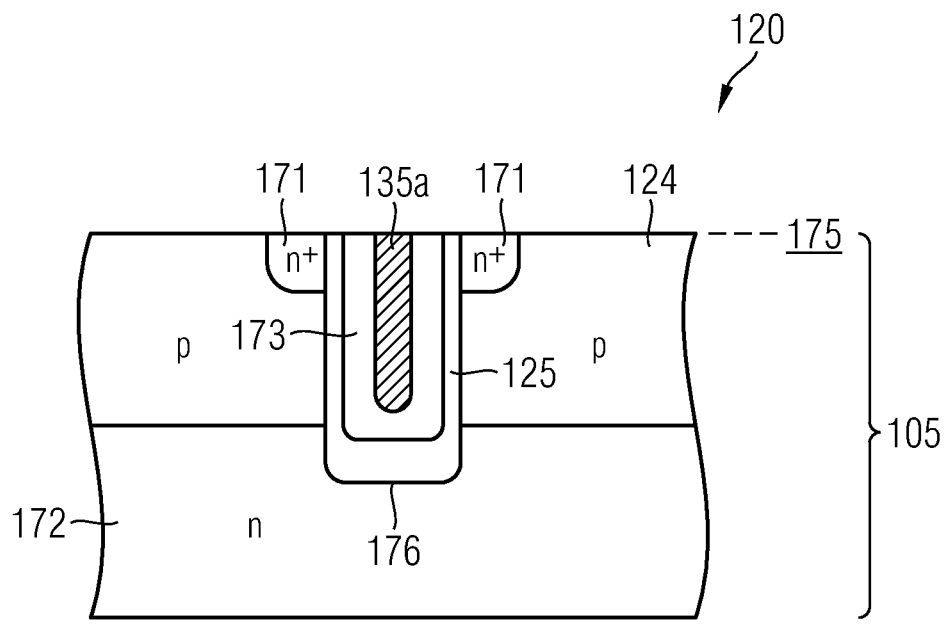

A cooling material 135a is disposed on the trench 176. The cooling material 135a is in mechanical and electrical contact with the gate electrode 173. The cooling material 135a causes a higher voltage drop after the phase/structural transition at high temperatures. This higher voltage drop results in a lower voltage applied to the gate and, consequently in a self-controlled turn-off of the device regions or transistor cells that undergo a critical temperature. The cooling material 135a counteracts hot spot generation and current filaments by acting as a heat sink when undergoing a phase transition. According to other embodiments, the cooling material 135a may also be disposed inside the trench 176 (c.f. FIGS. 1E and 1F).

Figure 1G:
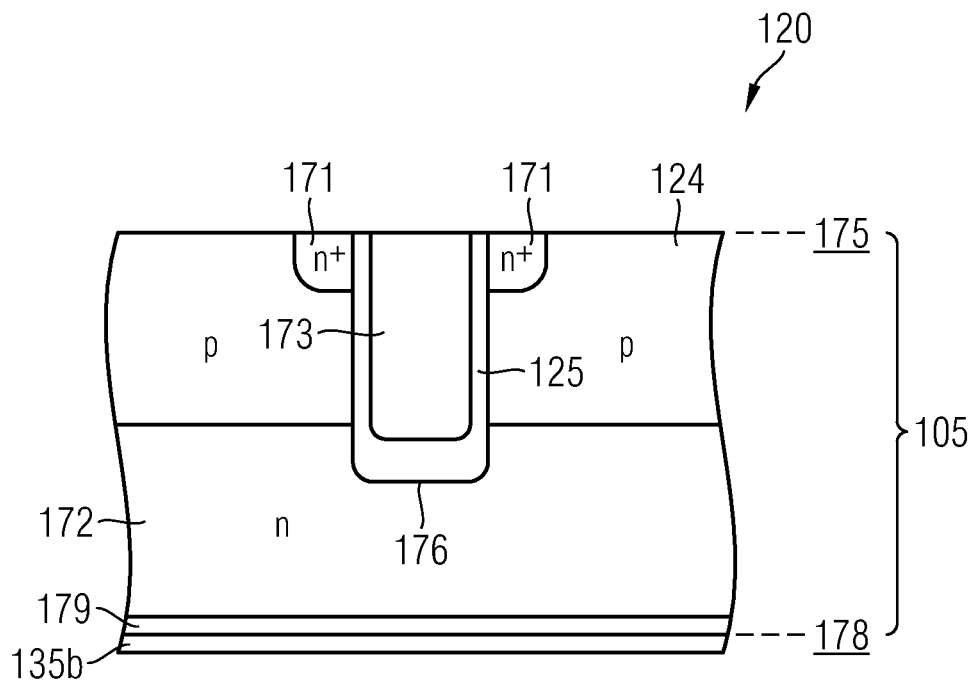

Referring to the schematic cross-sectional view of FIG. 1G, a cooling material 135b may also be disposed at a second surface 178 opposite to the first surface 175, e.g. at a rear side such as a drain terminal of an FET or a collector terminal of an IGBT. The cooling material 135b may include distinct parts, e.g. covering one or even a plurality of transistor cells. The cooling material 135b may also be large-area or extend over an overall surface of the semiconductor body 105. A contact region 179, e.g. a highly n$^+$-doped region and/or a metal layer or metal layer stack may be interposed between the n-doped region 172, e.g. drift zone and the cooling material 135b (c.f. FIG. 1G). During a current pulse of high amplitude the cooling material 135b counteracts hotspot formation and current filaments in the transistor cell array.

Figure 1H:
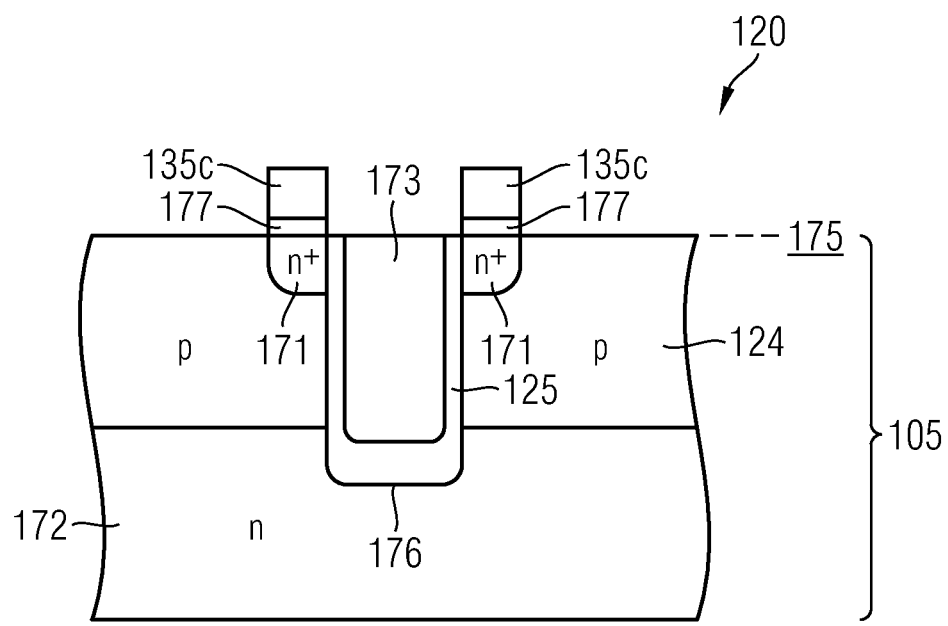

A cooling material 135c may also be disposed on the n$^+$-doped source region 171, e.g. with an intermediate contact region 177 (c.f. FIG. 1H). During a current pulse of high amplitude the cooling material 135c counteracts hotspot formation and current filaments in the transistor cell array. The cooling material 135c may include distinct parts, e.g. covering one or even a plurality of transistor cells. The cooling material 135c may also be large-area or extend over an overall surface of the semiconductor body 105. The same principle can be applied to insulated gate bipolar transistors (IGBTs). In this case, a p-doped emitter is formed between a rear side metallization and a drift zone. Optionally, a field stop zone is formed between the drift zone and the p-doped emitter.

Figure 2:
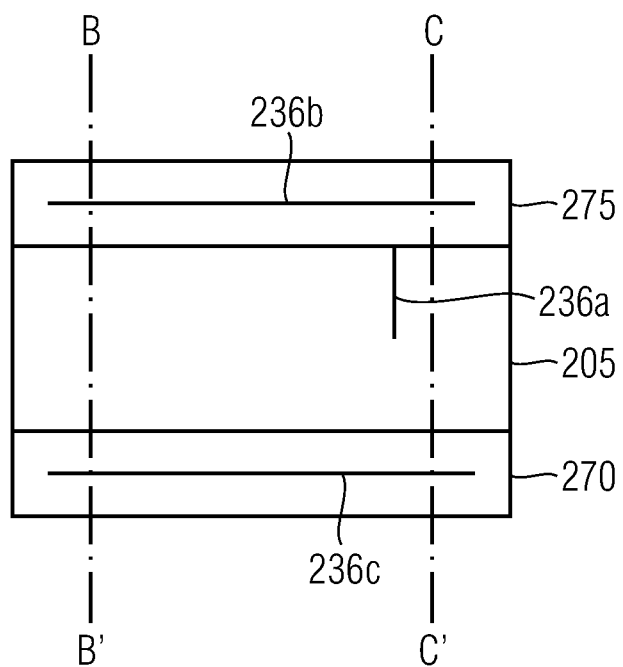
FIG. 2 illustrates a simplified schematic cross-sectional view of one embodiment of a power semiconductor device including a semiconductor body and a wiring structure, the wiring structure including a cooling material.

FIG. 2 illustrates a simplified cross-sectional view of a semiconductor body 205. According to one embodiment, the semiconductor body 205 includes as a portion or corresponds to the semiconductor body 105 as described with reference to FIGS. 1A to 1D. According to another embodiment the semiconductor body 205 includes a diode.

A rear side of the semiconductor body 205 is in contact with a rear side contact 270, e.g. a metal layer or a metal layer stack and a wiring layer 275 is disposed on a front side of the semiconductor body 205. The semiconductor body 205 includes a cooling material 236a which is illustrated in a simplified manner by a line. The cooling material 236a may be disposed in any part of the semiconductor body 205 where highest current pulses may appear, e.g. inside a gate trench as part of a gate line (c.f. FIGS. 1E, 1F). The cooling material 236a may extend into the semiconductor body 205 from the front side or from the rear side. A cooling material 236b may also be disposed locally or large-area in an area of the wiring layer 275, e.g. as part or in contact with a metallization layer, via, interlayer contact line or contact plug (c.f. FIGS. 1D, 1E, 1F). The cooling material 236b may include distinct parts, e.g. covering one or even a plurality of transistor cells. The cooling material 236b may also be large-area or extend over an overall surface of the semiconductor body 205. In FIG. 2, the cooling material 236b is illustrated in a simplified manner by a line. A cooling material 236c may also be disposed locally or large-area in an area of the rear side contact 270, e.g. as part or in contact with a metallization layer or metallization layer stack. The cooling material 236c may include distinct parts, e.g. covering one or even a plurality of transistor cells. The cooling material 236c may also be large-area or extended over an overall surface of the semiconductor body 205. In FIG. 2, the cooling material 236c is illustrated in a simplified manner by a line.

According to an embodiment, encapsulated or non-encapsulated cooling materials may be integrated as one or more thin layers, for example some 10 nm to some 10 μm thick in a chip front side passivation at a front side of the wiring structure or be used as a passivation having reversible cooling function.

According to another embodiment, the encapsulated or non-encapsulated cooling materials may be integrated as one or more thin layers, for example some 10 nm to some 10 μm thick below a chip metallization in interlevel dielectrics or be used an interlevel dielectric.

According to another embodiment, the encapsulated and non-encapsulated cooling materials may be integrated as one or more thin layers, for example some 10 nm to some 10 μm thick above of drain structures into semiconductor material. According to yet another embodiment, the encapsulated or non-encapsulated cooling materials may be integrated as one or more thin layers, for example some 10 nm to some 10 μm thick vertically into trench structures etched into semiconductor material.

The semiconductor body 205 may include edge regions surrounding or adjoining a central region as illustrated by lines BB' and CC' of FIG. 2. As an example, the edge region may be an edge termination area including edge termination structures, e.g. guard rings, field plates, Junction termination extension (JTE). The central region may include a transistor cell area or an active diode area, for example. The cooling materials 236a ... 236c may be disposed in or extend into the edge regions of the semiconductor body 205 to prevent damage to the semiconductor device, e.g. by high-amplitude current pulses in the edge regions.

In regards to the details of the cooling materials 236a ... 236c, such as characterizing parameters or materials, reference is taken to the embodiments illustrated in FIGS. 1A to 1H and the related part of the description above.

Figure 3A:
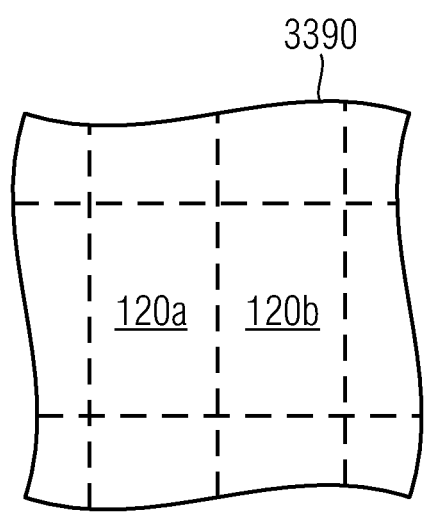
FIG. 3A illustrates a top view on two transistor cells covered by a continuous layer of a cooling material.

FIG. 3A illustrates one example of a top view of the semiconductor body 105 covered by a cooling material 3390. According to the illustrated part of the embodiment, the semiconductor body 105 includes transistor cells 120a and 120b of a transistor cell array, e.g. FET cell array or IGBT cell array. A continuous part of the cooling material 3390 has an area that is sufficiently large to cover a surface area of the two transistor cells 120a and 120b. According to an embodiment, the area of the cooling material 3390 ranges between $10^{-3}$ mm$^2$ to 1 mm$^2$ or typically between $5 \times 10^{-3}$ mm$^2$ and $10^{-1}$ mm$^2$.

Figure 3B:
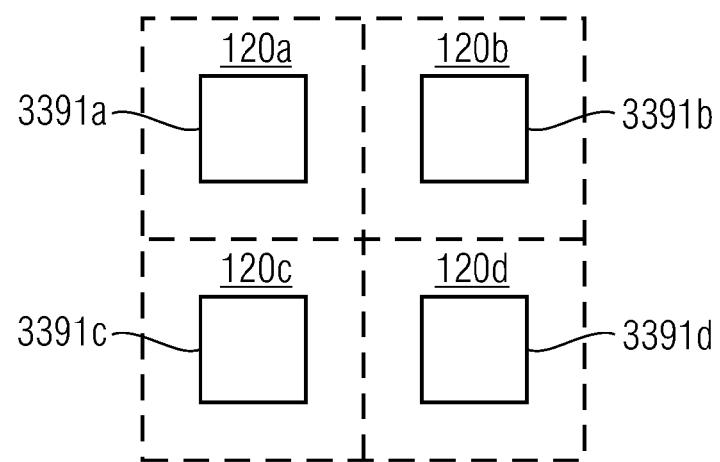
FIG. 3B illustrates a top view of a plurality of transistor cells, each transistor cell including a distinct or separate part of a cooling material.

FIG. 3B illustrates another example of a top view of the semiconductor body 105. According to the illustrated part of the embodiment, the semiconductor body 105 includes transistor cells 120a to 120d of a transistor cell array, e.g. FET cell array or IGBT cell array. Each of the transistor cells 120a to 120d includes distinct parts 3391a to 3391d of cooling material. The distinct parts 3391a to 3391d of the cooling material may be disposed in any parts of the transistor cells 120a to 120n, e.g. in one or in a combination of the semiconductor body, at a front side, e.g. in a wiring area, at a rear side, e.g. as part of a rear side contact.

In regards to further features of the cooling material 3390 and the parts 3391a to 3391d, such as characterizing parameters or materials, reference is taken to the embodiments illustrated in FIGS. 1A to 1H and the related part of the description above.

Figure 4:
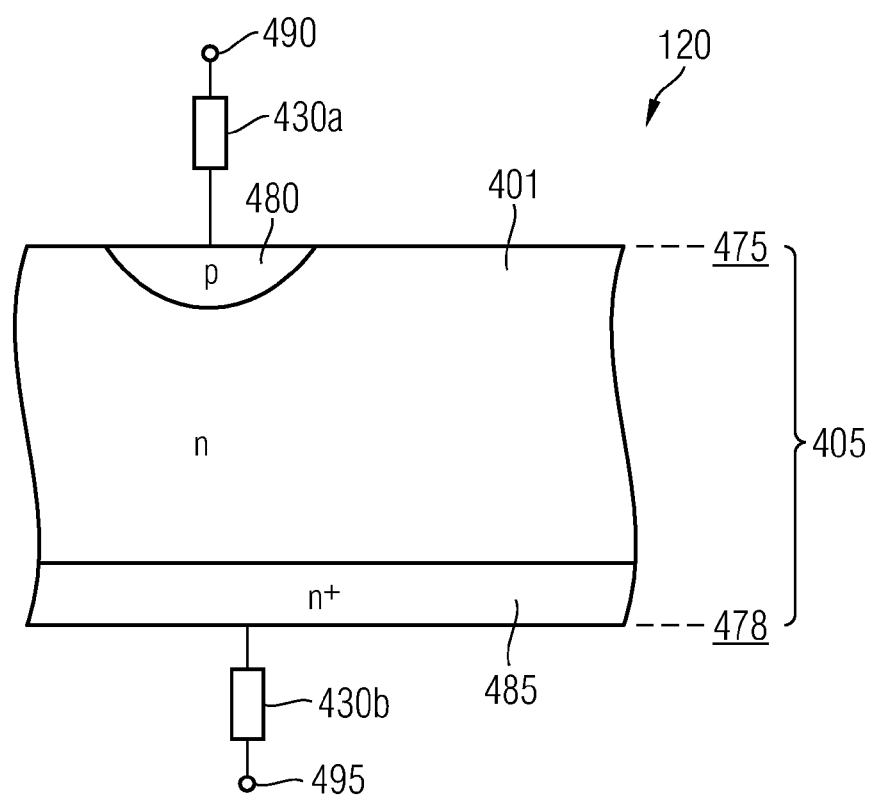
FIG. 4 illustrates a cross-sectional view of one embodiment of a diode including a cooling material as constituent part of or adjoining an electrical connection of a diode.

FIG. 4 illustrates a semiconductor device 400 that includes a diode in a semiconductor body 405 and further includes a cooling material. The semiconductor body 405 may include a semiconductor substrate, e.g. a silicon (Si) substrate, a silicon carbide (SiC) substrate or another semiconductor or semiconductor compound substrate and one or more optional semiconductor layers thereon.

At a first surface 475, e.g. a front side of the semiconductor body 405, a p-doped anode region 480 is formed. The p-doped anode region 480 is surrounded by an n-doped drift region 401 which adjoins an n$^+$-doped cathode region 485 at a second surface 478, e.g. a rear side. The anode region 480 is electrically coupled to an anode terminal 490, e.g. a contact area or bond pad. The cathode region 485 is electrically coupled to a cathode terminal 495, e.g. a rear side metallization layer or metallization layer stack.

Between the anode region 480 and the anode terminal 490 and/or between the cathode region 485 and the cathode terminal 495, a cooling material 430a, 430b is disposed. Similar to the embodiments illustrated in FIGS. 1A to 2, the cooling material 430a may be in contact with or part of the electrical connection from the anode region 480 to the anode terminal 490, e.g. as part of an wiring area and the cooling material 430b may be in contact with or part of the electrical connection from the cathode region 485 to the cathode terminal 495, e.g. as part of a rear side contact.

In regards to further features of the cooling material 430a, 430b of the semiconductor device 400, such as characterizing parameters or materials, reference is taken to the embodiments illustrated in FIGS. 1A to 1H and the related part of the description above.

In the context of the present specification, the term "metal" should be understood as including the more general term conductor. For example, the material of a electrode has not necessarily to be made out of metal but can also be made of any conducting material like e.g. a semiconductor layer of a metal-semiconductor compound of any other suitable material.

Further, terms such as "first", "second", and the like, are also used to describe various elements, regions, sections, etc. and are also not intended to be limiting. Like terms refer to like elements throughout the description.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
   a wiring structure adjoining at least one side of a semiconductor body and comprising at least one electrically conductive compound;
   a cooling material in the wiring structure, the cooling material being characterized by a change in structure by means of absorption of energy at a temperature $T_C$ ranging between 150° C. and 400° C., and
   wherein a rear side of the semiconductor body is mounted to a lead frame, and the cooling material adjoins at least one of a front side wiring layer of the wiring structure and a rear side contact material electrically coupling the semiconductor body and the lead frame.

2. The power semiconductor device of claim 1, wherein the cooling material is part of the wiring structure or integrated therein.

3. The power semiconductor device of claim 1, wherein the cooling material is a phase change material.

4. The power semiconductor device of claim 3, wherein a phase change of the phase change material is from a crystalline phase below $T_C$ to an amorphous phase above $T_C$.

5. The semiconductor power transistor of claim 4, wherein the phase change material includes a chalcogenide.

6. The power semiconductor device of claim 4, wherein the phase change material includes GeSbTe.

7. The power semiconductor device of claim 6, wherein the phase change material is doped with at least one of C, N, O, In.

8. The power semiconductor device of claim 3, wherein the phase change of the phase change material is from a solid phase below $T_C$ to a liquid phase above $T_C$.

9. The power semiconductor device of claim 8, wherein the phase change material includes a metal or a metal compound.

10. The power semiconductor device of claim 9, wherein the phase change material includes at least one metal of Sn, Bi, Zn, In.

11. The power semiconductor device of claim 3, wherein the phase change material is covered by a metallic structure.

12. The power semiconductor device of claim 11, wherein an intermediate layer is arranged between the metallic structure and the phase change material, the intermediate layer being non-reactive and immiscible with respect to each one of the metallic structure and the phase change material.

13. The power semiconductor device of claim 1, wherein the cooling material includes a solid-phase chemical compound and is characterized by a reversible structural change at the temperature $T_C$.

14. The power semiconductor device of claim 13, wherein the reversible structural change is a chemical isomerization.

15. The power semiconductor device of claim 13, wherein the chemical compound includes at least one of 1-ethyl-4-[4-methoxystyryl]-quinolinium compounds, cis-stilbazoliumbetaine compounds, N,N-dialkylaminostyrol dye, stilbenes, porphyrins, norbornadienes, spiro compounds, azo compounds.

16. The power semiconductor device of claim 13, wherein the chemical compound is a dielectric layer.

17. The power semiconductor device of claim 1, wherein the power semiconductor device is configured to conduct currents of more than 1 A between a first load terminal and a second load terminal.

18. The power semiconductor device of claim 1, wherein the temperature $T_C$ is between 200° C. and 300° C.

19. The power semiconductor device of claim 1, wherein the semiconductor body includes one of silicon and a wide bandgap material with a bandgap greater than 1.7 eV.

20. The power semiconductor device of claim 1, wherein the cooling material is part of or adjoins at least one of an electrical connection between a transistor cell array source contact and a first load terminal, an electrical connection between a transistor cell array gate contact and a control terminal, and an electrical connection between a transistor cell array drain contact and a second load terminal.

21. The power semiconductor device of claim 20, wherein the cooling material includes at least one continuous part congruent with a surface area of at least two of a plurality of transistor cells.

22. The power semiconductor device of claim 20, wherein the cooling material is located in an edge region of the power semiconductor device.

23. The power semiconductor device of claim 20, wherein each transistor cell of a plurality of transistor cells includes a part of the cooling material.

24. The power semiconductor device of claim 1, wherein the cooling material is part of or adjoins at least one of an electrical connection between the semiconductor body and an anode terminal of a diode and an electrical connection between a semiconductor body and a cathode terminal of the diode.

25. The power semiconductor device of claim 1, wherein the structural change by means of energy absorption is combined with an increase of a specific resistance of the cooling material.

* * * * *